United States Patent
Bao et al.

(10) Patent No.: US 9,231,620 B2
(45) Date of Patent: Jan. 5, 2016

(54) ITERATIVE DECODING DEVICE AND RELATED DECODING METHOD FOR IRREGULAR LOW-DENSITY PARITY-CHECK CODE CAPABLE OF IMPROVING ERROR CORRECTION PERFORMANCE

(71) Applicant: NOVATEK Microelectronics Corp., Hsin-Chu (TW)

(72) Inventors: Dan Bao, Shanghai (CN); Dawei Deng, Shanghai (CN); Song Qian, Shanghai (CN); Bo Shen, Shanghai (CN)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 284 days.

(21) Appl. No.: 13/646,747

(22) Filed: Oct. 8, 2012

(65) Prior Publication Data

US 2014/0013190 A1    Jan. 9, 2014

(30) Foreign Application Priority Data

Jul. 3, 2012    (CN) .......................... 2012 1 0227510

(51) Int. Cl.
*H03M 13/45* (2006.01)
*H03M 13/00* (2006.01)
*G06F 11/00* (2006.01)
*H03M 13/11* (2006.01)

(52) U.S. Cl.
CPC ........ *H03M 13/1111* (2013.01); *H03M 13/658* (2013.01)

(58) Field of Classification Search
None
See application file for complete search history.

(56) References Cited

U.S. PATENT DOCUMENTS

| | | | |
|---|---|---|---|
| 7,827,461 B1 | 11/2010 | Low | |
| 8,205,130 B2 * | 6/2012 | Shinagawa et al. | 714/752 |
| 8,316,272 B2 * | 11/2012 | Gunnam | 714/752 |
| 8,418,019 B2 * | 4/2013 | Ivkovic et al. | 714/752 |
| 8,429,498 B1 * | 4/2013 | Anholt et al. | 714/764 |
| 8,438,461 B2 * | 5/2013 | Varnica et al. | 714/785 |
| 8,578,238 B2 * | 11/2013 | Priewasser et al. | 714/758 |
| 8,656,250 B2 * | 2/2014 | Gunnam et al. | 714/758 |
| 8,661,311 B2 * | 2/2014 | Yang et al. | 714/752 |
| 8,749,907 B2 * | 6/2014 | Zhang et al. | 360/39 |
| 8,773,790 B2 * | 7/2014 | Tan et al. | 360/39 |
| 2004/0168114 A1 | 8/2004 | Richardson | |
| 2006/0193400 A1 * | 8/2006 | Morris et al. | 375/316 |
| 2007/0297496 A1 * | 12/2007 | Park et al. | 375/148 |
| 2008/0276156 A1 | 11/2008 | Gunnam | |
| 2009/0222711 A1 * | 9/2009 | Belogolovy | 714/780 |
| 2011/0231731 A1 * | 9/2011 | Gross et al. | 714/760 |
| 2013/0061114 A1 * | 3/2013 | Malmirchegini et al. | 714/763 |
| 2014/0181612 A1 * | 6/2014 | Gunnam et al. | 714/752 |

* cited by examiner

*Primary Examiner* — Justin R Knapp
(74) *Attorney, Agent, or Firm* — Winston Hsu; Scott Margo

(57) ABSTRACT

An iterative decoding device includes a decoder, a dual mode determination unit and a dual mode scaling unit. The decoder is utilized for receiving a set of soft information (SI) and iteratively decoding the set of SI and updating the set of SI accordingly to generate a set of updated SI. The dual mode determination unit is coupled to the decoder for generating a determination result according to the set of updated SI. The dual mode scaling unit is coupled to the dual mode determination unit and the decoder for scaling the set of updated SI according to the determination result to generate a set of scaled SI acting as an input of the decoder for next iteration.

24 Claims, 7 Drawing Sheets

ITERATIVE DECODING DEVICE AND RELATED DECODING METHOD FOR IRREGULAR LOW-DENSITY PARITY-CHECK CODE CAPABLE OF IMPROVING ERROR CORRECTION PERFORMANCE

BACKGROUND OF THE INVENTION

1. Field of the Invention

The present invention relates to an iterative decoding device and relative decoding method, and more particularly, to an iterative decoding device and related decoding method capable of improving error correction performance.

2. Description of the Prior Art

The communication of information between computers and other electronic devices can be achieved by using a variety of different specifications and technologies. For example, channel coding and error correction are used to reduce error of received signal due to distortion or other interference. Such encoding and error correction techniques can be achieved by using the encoder and decoder at the both end of transmission channel.

For example, any decoding algorithms for low density parity check code (LDPC code), such as belief propagation algorithm, normalized min-sum algorithm (NMSA), and offset min-sum algorithm (OMSA), can be applied to the receiver for decoding the received codeword. In general, an iterative decoder is used to provide decoding results converged to the correct codeword. For example, a message-passing algorithm (MPA) based on soft decision may be used for LDPC decoding at the receiving end. A plurality of received bits (e.g. a plurality of channel results) can be regarded as a plurality of variables representing probability of value "0" or value "1". The plurality of variables may be represented by a plurality of log likelihood ratios (LLRs) in the decoding algorithm. In the message passing algorithm, the soft information (e.g. LLR) is passed from a bit node to a check node and syndrome of current iteration is calculated. After that, the soft information can be passed from the check node to the bit node and the same procedure is repeated iteratively until the convergence condition is reached (e.g. the check parity of syndrome are all zero). LDPC code is a well-known technique and has been introduced in a large number of materials, such as U.S. published patent application No. 2011/0307755, "STRUCTURED LOW-DENSITY PARITY-CHECK (LDPC) CODE" and U.S. Pat. No. 7,707, 479, "Method of generating structured irregular low density parity checkcodes for wireless systems".

However, for the LPDC decoding, the soft information may be gradually enlarged for improving the reliability of the determination during the iterative decoding process, so that the soft information would exceed the range of finite word length, thus resulting in decoding errors. Therefore, the soft information needs to be scaled to prevent the soft information from exceeding the range of finite word length. For example, please refer to FIG. 1, which illustrates a schematic diagram of a conventional iterative decoding device 10. The iterative decoding device 10 includes a decoder 100 and a scaling unit 102. The decoder 100 is used for receiving a set of soft information Si, iteratively decoding the aforementioned soft information and updating the aforementioned soft information accordingly to generate a set of updated soft information USi. The scaling unit 102 is coupled to decoder 100 for scaling the updated soft information USi to generate a set of scaled soft information SSi acting as an input of the decoder 100 for next iteration in order to avoid the soft information exceeding the range of finite word length during the iterative decoding process. However, the method can only be applied to a regular LDPC decoder, but can not be applied to an irregular LDPC decoder for improving error correction performance of the irregular LDPC decoder. Thus, the prior art has to be improved.

SUMMARY OF THE INVENTION

It is therefore an objective of the present invention to provide an iterative decoding device and related method.

The present invention discloses an iterative decoding device includes a decoder, a dual-mode determination unit, and a dual-mode scaling unit. The decoder is used for receiving a set of soft information, iteratively decoding the soft information and updating the set of soft information accordingly to generate a set of updated soft information. The dual-mode determination unit is coupled to the decoder for generating a determination result according to the set of updated soft information. The dual-mode scaling unit is coupled to the dual-mode determination unit and the decoder for scaling the set of updated soft information according to the determination result to generate a set of scaled soft information acting as an input of the decoder for next iteration.

The present invention further discloses a method for iterative decoding for a decoder. The method includes receiving a set of soft information, iteratively decoding the soft information, and updating the set of soft information to generate a set of updated soft information, generating a determination result according to the set of updated soft information, and scaling the set of updated soft information according to the determination result to generate a set of scaled soft information acting as an input of the decoder for next iteration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
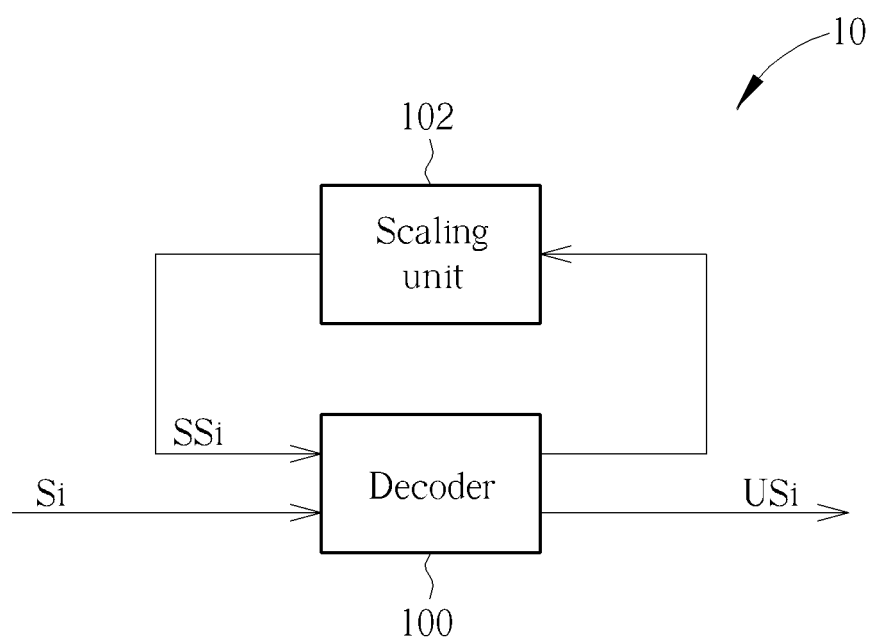
FIG. 1 illustrates a schematic diagram of a conventional iterative decoding device according to the prior art.
Figure 2:
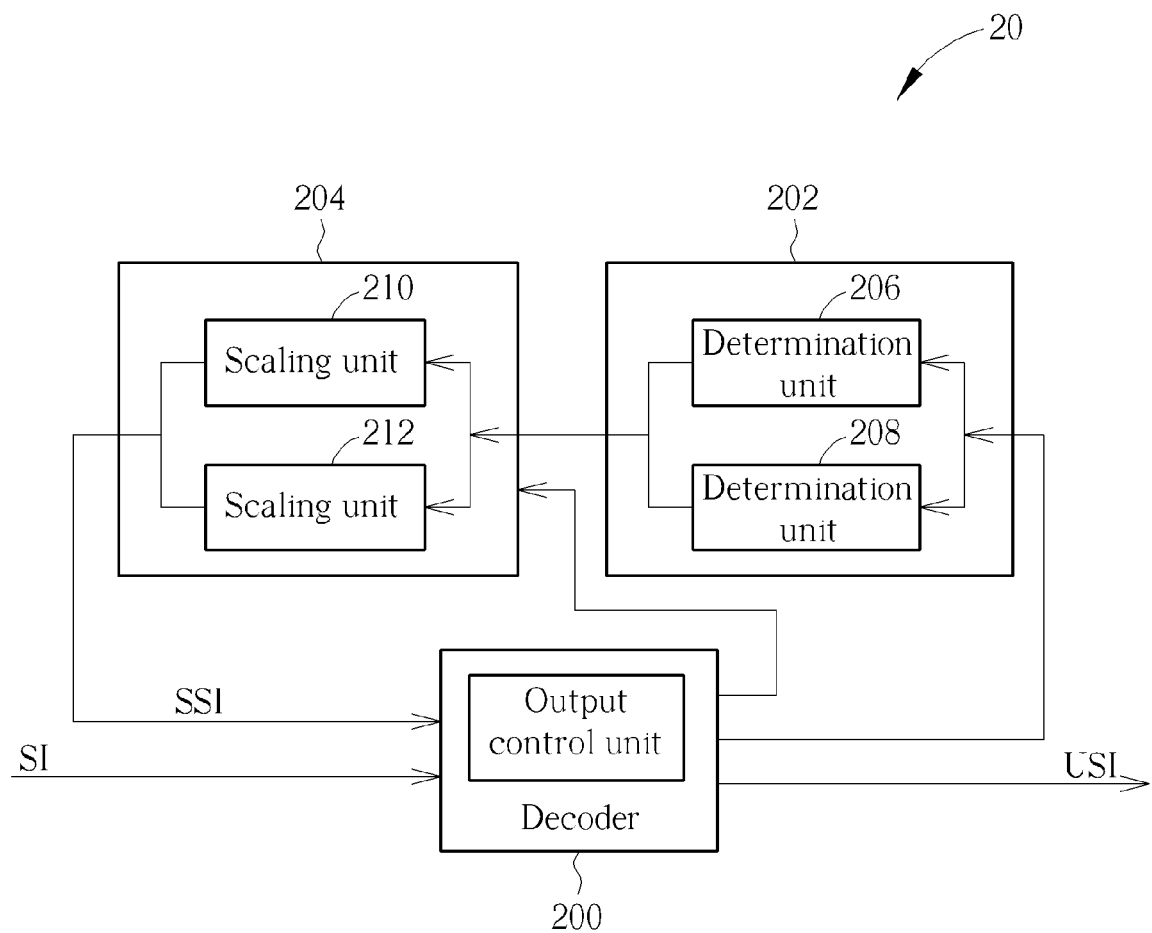
FIG. 2 illustrates a schematic diagram of an iterative decoding device according to an embodiment of the invention.

Please refer to FIG. 2, which illustrates a schematic diagram of an iterative decoding device 20 according to an embodiment of the invention. The iterative decoding device 20 includes a decoder 200, a dual-mode determination unit 202 and a dual-mode scaling unit 204. The decoder 200 is used for receiving a set of soft information SI, iteratively decoding the soft information SI and updating the soft information SI to generate a set of updated soft information USI accordingly. The decoder 200 performs a decoding process on the received soft information to generate a decoding result and the decoding result is applied as the updated soft information USI in each decoding iteration process. In other words, the decoder 200 can be used to perform the iterative decoding process. Preferably, the decoder 200 is an irregular LDPC decoder. The dual-mode determination unit 202 is coupled to the decoder 200 for generating a determination result DR served as the basis for deciding whether to scale according to the set of updated soft information USI. The dual-mode scaling unit 204 is coupled to the dual-mode determination unit 202 and the decoder 200 for scaling the updated soft information USI according to the determination result DR, to generate a set of scaled soft information SSI. The scaled soft information SSI can act as an input of the decoder 200 for next iteration. In other words, the updated soft information USI is outputted to the dual-mode determination unit 202 and the dual-mode scaling unit 204 by the decoder 200 after each decoding iteration, and the above procedure is repeated iteratively to obtain the most accurate soft information, thereby improving the error correction performance of the decoder 200.

In brief, the iterative decoding device 20 of the present invention iteratively determines and scales the soft information during the iterative decoding period to avoid the soft information exceeding the range of finite word length. As a result, the most accurate soft information can be obtained for improving error correction performance of the decoder 200.

According to an embodiment of the present invention, the updated soft information USI can be timely scaled to generate the scaled soft information SSI through collaborative operations of the dual-mode determination unit 202 and the dual-mode scaling unit 204. Moreover, the scaled soft information SSI can be treated as an input of the decoder 200 for next iteration. As shown in FIG. 2, the dual-mode determination unit 202 includes the determination units 206 and 208. The dual-mode scaling unit 204 includes the scaling units 210 and 212. The decoder 200 outputs the updated soft information USI to the dual-mode determination unit 202 and the dual-mode scaling unit 204 after each decoding iteration. Therefore, the determination unit 206 determines whether the scaling unit 210 needs to perform scaling operations and generates the determination result DR1 according to a threshold value TH1 and a set of high weight soft information HSI of the updated soft information USI when a scaling counter value SV1 is less than or equal to a predetermined value PV. The scaling counter value SV1 represents the cumulative number of times that the scaling unit 210 performs the scaling operations. When the determination result DR1 indicates performing scaling operations, the scaling unit 210 scales the high weight soft information HSI to generate a set of scaled soft information SSI1 acting as the input of the decoder 200 for next iteration. Furthermore, the determination unit 208 determines whether the scaling unit 212 needs to scale and generates the determination result DR2 according to a threshold value TH2 and the updated soft information USI when a scaling counter value SV1 is greater than the predetermined value PV. When the determination result DR2 indicates performing scaling operations, the scaling unit 212 scales the updated soft information USI to generate a set of scaled soft information SSI2.

On the other hand, the dual-mode scaling unit further includes a scaling counter for counting the number of times that the scaling unit 210 performs the scaling operations, so as to generate the scaling counter value, e.g. the above-mentioned scaling counter value SV1. For example, after the decoder 200 performs an iterative decoding operation and outputs the updated soft information USI to the dual-mode determination unit 202, the dual-mode determination unit 202 determines whether the determination unit 206 or the determination unit 208 performs relative determination processes according to the scaling counter value SV1 generated by the scaling counter.

In short, the determination 206 and the scaling unit 210 perform determination and scaling operations on the high weight soft information of the updated soft information USI during the iterative decoding process of the decoder 200. After the scaling unit 210 has performed scaling operations a certain number of times (e.g. PV times), the determination unit 208 and the scaling unit 212 further perform determination and scaling operations on all soft information of the updated soft information USI. In such a situation, the scaled soft information SSI1 can act as an input of the decoder 100 for next iteration when the scaling counter value SV1 is less than or equal to the predetermined value PV. Similarly, the scaled soft information SSI2 can act as an input of the decoder 100 for next iteration when the scaling counter value SV1 is greater than the predetermined value PV.

Figure 3:
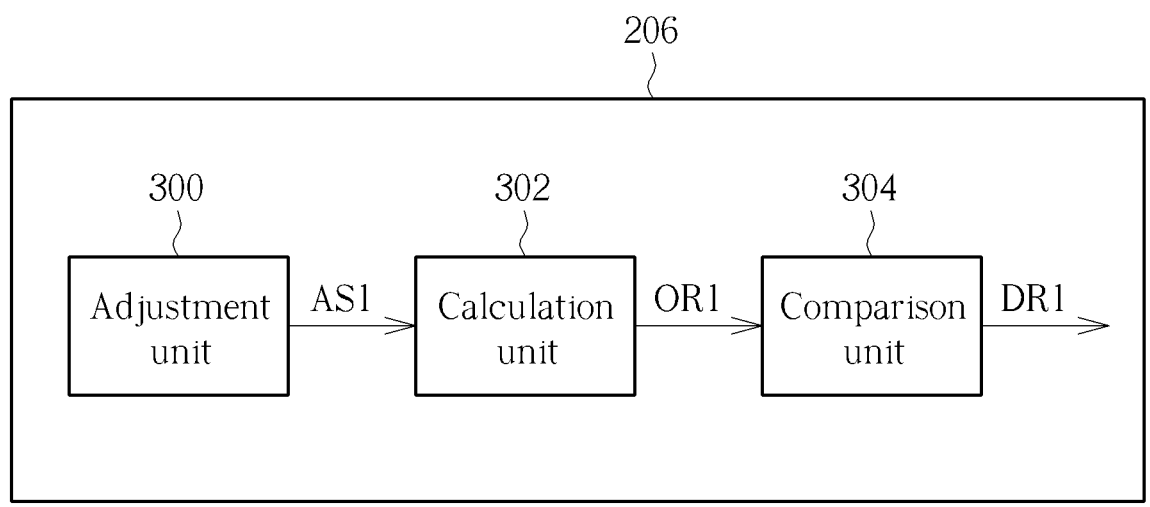
FIG. 3 illustrates a schematic diagram of the determination unit generating the determination result when the scaling counter value is less than or equal to the predetermined value according to an embodiment of the invention.

In details, please refer to FIG. 3, which illustrates a schematic diagram of the determination unit 206 generating the determination result DR1 when the scaling counter value SV1 is less than or equal to the predetermined value PV according to an embodiment of the invention. The determination unit 206 includes an adjustment unit 300, a calculation unit 302, and a comparison unit 304. The adjustment unit 300 is used for calculating absolute values of the high weight soft information HSI to generate a set of adjustment signals AS1. The calculation unit 302 is coupled to the adjustment unit 300 for calculating average energy of the high weight soft information HSI to generate a calculating result OR1 according to the adjustment signals AS1. In other words, the calculating result OR1 represents the average energy of the high weight soft information HSI. The comparison unit 304 is coupled to the calculation unit 302 for comparing the calculating result OR1 with the threshold value TH1 to generate the determination result DR1 to the scaling unit 210. More specifically, the determination result DR1 indicates that the scaling unit 210 needs to perform scaling operations when the calculating result OR1 is greater than the threshold value TH1, and the determination result DR1 indicates that the scaling unit does not need to perform the scaling operation when the calculating result OR1 is smaller than the threshold value TH1. Furthermore, when the scaling counter value SV1 is less than or equal to the predetermined value PV and the determination result DR1 indicates performing scaling operations, the scaling unit 210 scales the high weight soft information HS and accordingly generates the scaled soft information SSI1 acting as the input of the decoder 200 for next iteration. Moreover, the scaling counter value SV1 is updated (i.e. the counter value SV1 increases one). Note that the iterative decoding device 20 repeats the above procedure when the scaling counter value SV1 is less than or equal to the predetermined value PV.

In addition, the decoder 200 further includes an output control unit, which is used for counting the number of times of iterative decoding for the decoder 200 and determining whether a convergence condition is reached according to the updated soft information USI. Meanwhile, the output control unit determines that the decoding process is terminated and outputs the updated soft information USI as the decoding result when the number of times of iterative decoding of the decoder is greater than an iterative predetermined value PV_ite or the decoder meets the convergence condition.

Therefore, the present invention can scale the high weight soft information HSI, generate the scaled soft information SSI1, and update the updated soft information USI via the collaborative operations of the determination unit 206 and the scaling unit 210 when the scaling counter value SV1 is less than or equal to the predetermined value PV and the updated soft information USI does not satisfy the convergence condition or the iterative decoding number of times is less than the iterative predetermined value PV_ite. Thereby, the present invention can avoid the soft information exceeding the range of finite word length during the iterative decoding of the irregular LDPC decoder for improving error correction performance.

Figure 4:
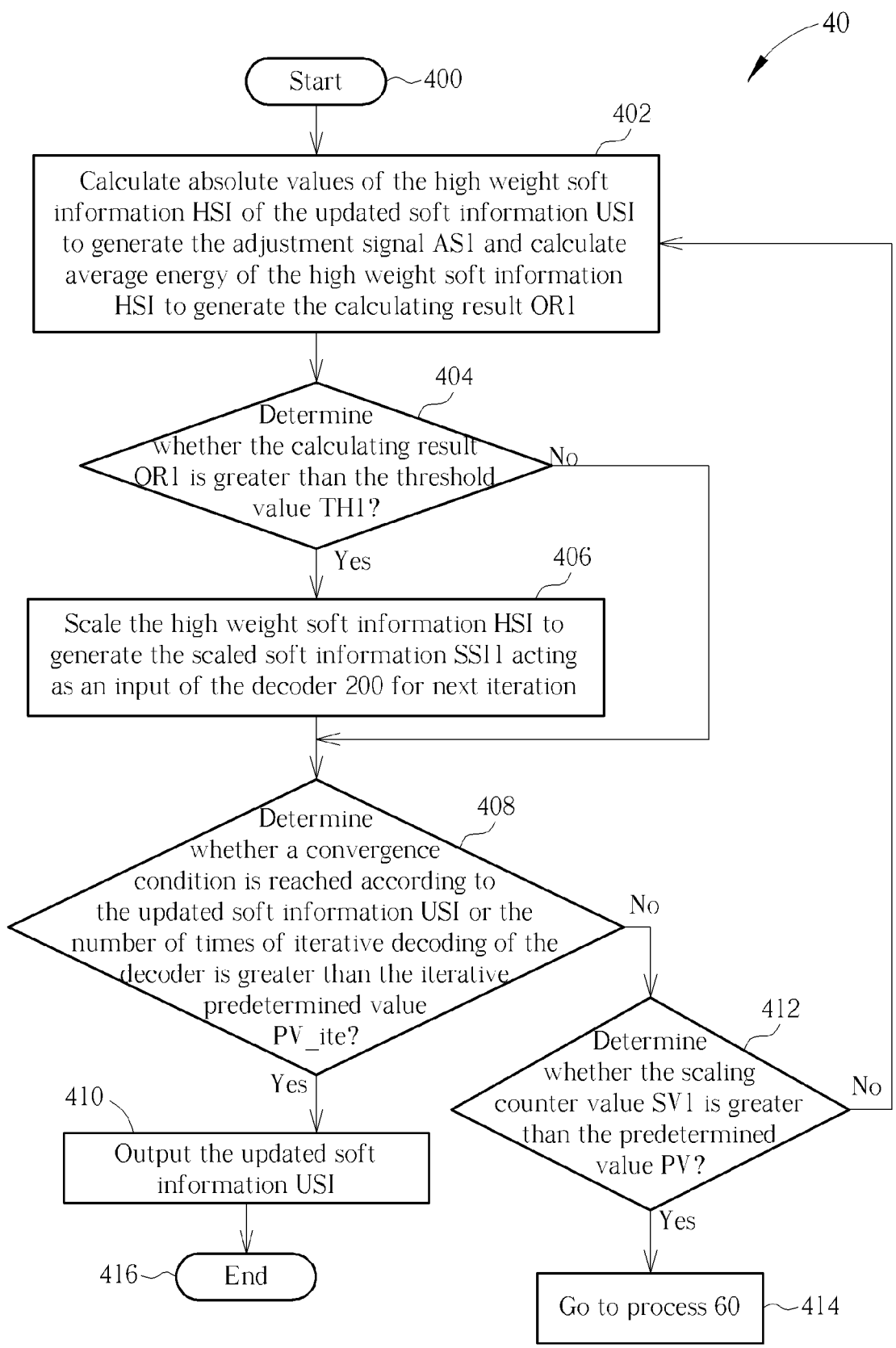
FIG. 4 illustrates a schematic diagram of the operating process of the determination unit and the scaling unit according to an embodiment of the invention.

Operations of the determination unit 206 and the scaling unit 210 can be summarized in a process 40. As shown in FIG. 4, the process 40 includes the following steps:

Step 400: Start.

Step 402: Calculate absolute values of the high weight soft information HSI of the updated soft information USI to generate the adjustment signal AS1 and calculate average energy of the high weight soft information HSI to generate the calculating result OR1.

Step 404: Determine whether the calculating result OR1 is greater than the threshold value TH1. If yes, go to Step 406. If no, go to Step 408.

Step 406: Scale the high weight soft information HSI to generate the scaled soft information SSI1 acting as an input of the decoder 200 for next iteration.

Step 408: Determine whether a convergence condition is reached according to the updated soft information USI or the number of times of iterative decoding of the decoder is greater than the iterative predetermined value PV_ite. If yes, go to Step 410. If no, go to Step 412.

Step 410: Output the updated soft information USI.

Step 412: Determine whether the scaling counter value SV1 is greater than the predetermined value PV. If yes, go to step 414. If no, go to Step 402.

Step 414: Go to process 60.

Step 416: End.

Detailed description and the related variations of the process 40 can be referred from the foregoing description and are not narrated herein for brevity.

Note that, each of the soft information of the invention is one of the information of a check node to a bit node or the bit node to the check node, which is a log likelihood ratio (LLR) of a target bit. Those skilled in the art will observe that numerous modifications and alterations, and this should not be limited herein. In addition, the aforementioned predetermined value PV may depend on the iterative decoding number of times. For example, the predetermined value PV can be two or three when the iterative decoding number of times is performed twenty times.

Figure 5:
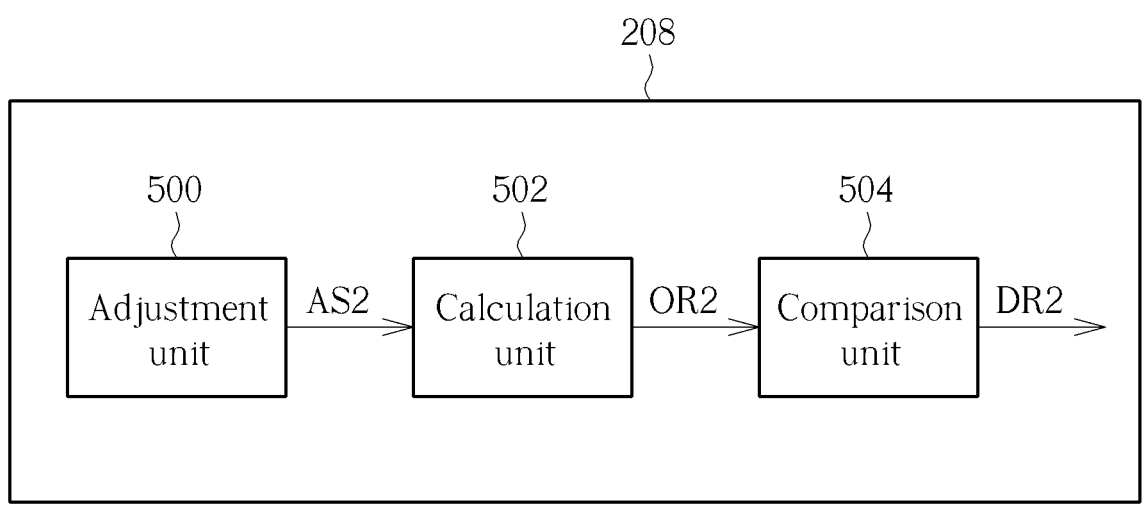
FIG. 5 illustrates a schematic diagram of the determination unit generating the determination result when the scaling counter value is greater than the predetermined value according to an embodiment of the invention.

Furthermore, when the scaling counter value SV1 is greater than the predetermined value PV, the iterative decoding device 20 will perform the next iterative decoding process, i.e. the process 60. Please refer to FIG. 5, which illustrates a schematic diagram of the determination unit 208 generating the determination result DR2 when the scaling counter value SV1 is greater than the predetermined value PV according to an embodiment of the invention. The determination unit 208 includes an adjustment unit 500, a calculation unit 502 and a comparison unit 504. The adjustment unit 500 is used for calculating absolute values of the updated soft information USI to generate a set of adjustment signals AS2. The calculation unit 502 is coupled to the adjustment unit 500 for calculating average energy of the updated soft information USI to generate a calculating result OR2 according to the adjustment signals AS2. In other words, the calculating result OR2 represents average energy of the updated soft information USI. The comparison unit 504 is coupled to the calculation unit 502 for comparing the calculating result OR2 with the threshold value TH2 to generate the determination result DR2 to the scaling unit 212. More specifically, the determination result DR2 indicates that the scaling unit 212 needs to perform scaling operations when the calculating result OR2 is greater than the threshold value TH2, and the determination result DR2 indicates that the scaling unit 212 does not need to perform the scaling operation when the calculating result OR2 is smaller than the threshold value TH2.

Next, when the scaling counter value SV1 is greater than the predetermined value PV and the determination result DR2 indicates performing scaling operations, the scaling unit 212 scales the updated soft information USI and accordingly generates the scaled soft information SSI2 to be used as the input of the decoder 200 for next iteration. Meanwhile, the scaling counter value SV2 is updated. Note that the iterative decoding device 20 will repeat the above procedure, the decoder 200 or the aforementioned output control unit determines that the decoding process is terminated and outputs the updated soft information USI as the decoding result when the number of times of iterative decoding of the decoder is greater than an iterative predetermined value PV_ite or the decoder achieves the convergence condition. In other words, the present invention can scale the updated soft information USI, generates the scaled soft information SSI2, and updates the updated soft information USI via the collaborative operations of the determination unit 208 and the scaling unit 212 when the scaling counter value SV1 is greater than the predetermined value PV and the updated soft information USI does not satisfy the convergence condition or the iterative decoding number of times is less than the iterative predetermined value PV_ite. Thereby, the present invention can avoid the soft information exceeding the range of finite word length during the iterative decoding of the irregular LDPC decoder for improving error correction performance.

Figure 6:
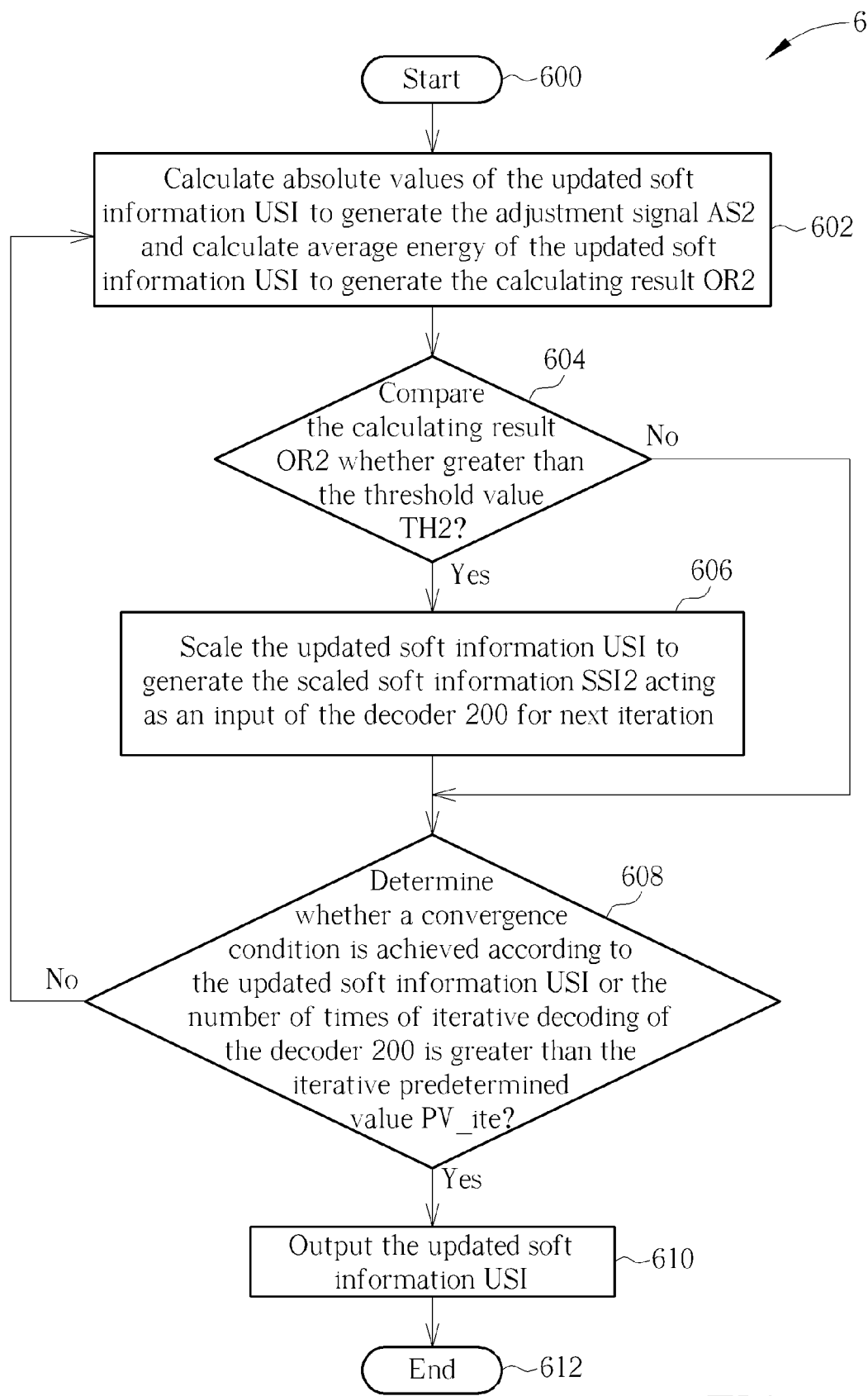
FIG. 6 illustrates another schematic diagram of the operating process of the determination unit and the scaling unit according to an embodiment of the invention.

Operations of the determination unit 208 and the scaling unit 212 can be summarized in a process 60. As shown in FIG. 6, the process 60 includes the following steps:

Step 600: Start.

Step 602: Calculate absolute values of the updated soft information USI to generate the adjustment signal AS2 and calculate average energy of the updated soft information USI to generate the calculating result OR2.

Step 604: Compare the calculating result OR2 whether greater than the threshold value TH2. If yes, proceed to step 606. If not, proceed to step 608.

Step 606: Scale the updated soft information USI to generate the scaled soft information SSI2 acting as an input of the decoder 200 for next iteration.

Step 608: Determine whether a convergence condition is achieved according to the updated soft information USI or the number of times of iterative decoding of the decoder 200 is greater than the iterative predetermined value PV_ite. If yes, proceed to step 610. If not, proceed to step 602.

Step 610: Output the updated soft information USI.

Step 612: End.

Detailed description and the related variations of the process 60 can be referred from the foregoing description and is not narrated herein for brevity.

Figure 7:
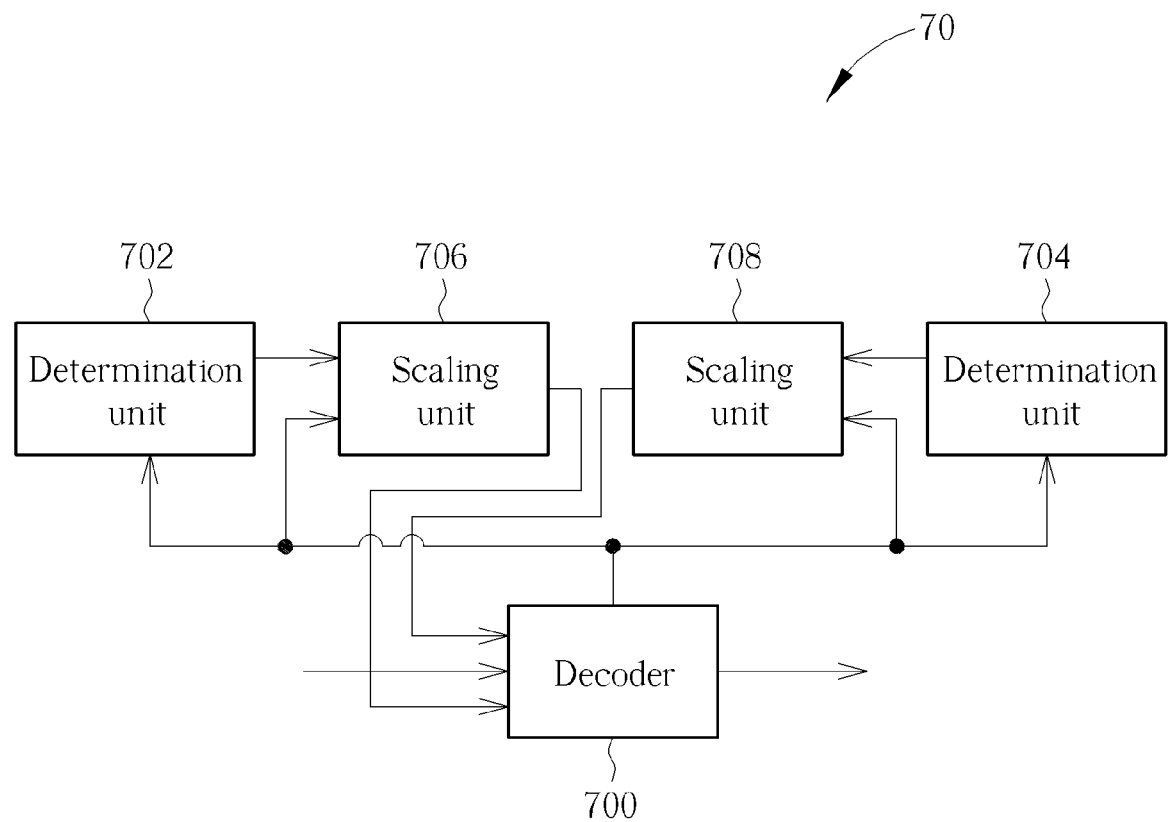
FIG. 7 illustrates a schematic diagram of an iterative decoding device according to an embodiment of the invention.

On the other hand, FIG. 2 illustrates an embodiment conception according to the invention. Those skilled in the art will observe that numerous modifications and alterations and are not limited herein. For example, please refer to FIG. 7, which illustrates a schematic diagram of an iterative decoding device 70 according to an embodiment of the invention. The iterative decoding device 70 includes a decoder 700, determination units 702 and 704, and the scaling units 706 and 708. The components with the same symbols shown in FIGS. 2 and 7 have similar operation methods and functions, and further description will be omitted for brevity. The connections between those components are as shown as FIG. 7. Different from the iterative decoding device 20 shown in FIG. 2, the determination units 702 and 704 and the scaling units 706 and 708 are independently disposed in the iterative decoding device 70. In such a case, the iterative decoding device 70 of the invention can also avoid the soft information exceeding the range of finite word length during the iterative decoding of the irregular LDPC decoder so as to improve error correction performance.

In summary, the conventional iterative decoding device can only be applied to improve the performance of error correction of regular LDPC decoder, instead of being used in irregular LDPC decoder. In contract, the iterative decoding device of the invention separates the iterative decoding method into a two-stage process to avoid the problem of decoding error due to the soft information exceeding the range of finite word length in the iterative decoding of the irregular LDPC decoder, thus improving the decoding performance of the iterative device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An iterative decoding device comprising:
a decoder for receiving a set of soft information, iteratively decoding the soft information and updating the set of soft information accordingly to generate a set of updated soft information;
a dual-mode determination unit coupled to the decoder for generating a determination result, which indicates that a scaling operation is needed to be performed or not, according to a threshold value and the set of updated soft information, wherein the threshold value is set to a first threshold value or a second value based on a comparison result of comparing a scaling counter value, which indicates the number of times that the scaling operation is performed, and a predetermined value; and
a dual-mode scaling unit coupled to the dual-mode determination unit and the decoder for generating the scaling counter value and performing the scaling operation that is to scale the set of updated soft information according to the determination result, so as to generate a set of scaled soft information acting as an input of the decoder for next iteration.

2. The iterative decoding device of claim 1, wherein the dual-mode determination unit comprises:
a first determination unit for generating the determination result according to the first threshold value and a set of high weight soft information of the set of updated soft information when the comparison result indicates that the scaling counter value is less than or equal to the predetermined value;
wherein the set of high weight soft information is soft information of some nodes in a parity-check matrix which are with a relatively-large number of non-zero soft information in comparison with soft information of other nodes in the parity-check matrix, wherein a node in the parity-check matrix means a column or a row in the parity-check matrix.

3. The iterative decoding device of claim 2, wherein the first determination unit comprises:
a first adjustment unit for calculating absolute values of the set of high weight soft information to generate a set of first adjustment signals;
a first calculation unit coupled to the first adjustment unit for calculating average energy of the set of high weight soft information to generate a first calculating result according to the set of first adjustment signals; and
a first comparison unit coupled to the first calculation unit for comparing the first calculating result with the first threshold value to generate the determination result.

4. The iterative decoding device of claim 3, wherein the determination result indicates that the dual-mode scaling unit performs the scaling operation when the first calculating result is greater than the first threshold value, and the determination result indicates the dual-mode scaling unit does not perform the scaling operation when the first calculating result is smaller than the first threshold value.

5. The iterative decoding device of claim 2, wherein the dual-mode scaling unit comprises:
a first scaling unit coupled to the first determination unit and the decoder for scaling the set of high weight soft information when the determination result indicates performing the scaling operation and the determination result is generated under a condition that the scaling counter value is less than or equal to the predetermined value, and accordingly generating a set of scaled soft information acting as the input of the decoder for next iteration.

6. The iterative decoding device of claim 5, wherein the dual-mode scaling unit comprises:
a scaling counter for counting the number of times that the first scaling unit performs the scaling operation, so as to generate the scaling counter value.

7. The iterative decoding device of claim 1, wherein the dual-mode determination unit comprises:
a second determination unit for generating the determination result according to the second threshold value and the set of updated soft information when the comparison result indicates that the scaling counter value is greater than the predetermined value.

8. The iterative decoding device of claim 7, wherein the second determination unit comprises:
a second adjustment unit for calculating absolute values of the set of updated soft information to generate a set of second adjustment signals;
a second calculation unit coupled to the second adjustment unit for calculating average energy of the set of updated soft information to generate a second calculating result according to the set of second adjustment signals; and
a second comparison unit coupled to the second calculation unit for comparing the second calculating result with the second threshold value to generate the determination result.

9. The iterative decoding device of claim 8, wherein the determination result indicates that the dual-mode scaling unit performs the scaling operation when the second calculating result is greater than the second threshold value, and the determination result indicates that the dual-mode scaling unit does not perform the scaling operations when the second calculating result is smaller than the second threshold value.

10. The iterative decoding device of claim 7, wherein the dual-mode scaling unit comprises:
a second scaling unit coupled to the second determination unit and the decoder for scaling the set of updated soft information when the determination result indicates performing the scaling operation and the determination result is generated under a condition that the scaling counter value is greater than the predetermined value, and accordingly generating a set of scaled soft information acting as the input of the decoder for next iteration.

11. The iterative decoding device of claim 1, wherein the decoder comprises:
an output control unit for counting a number of times of iterative decoding for the decoder and determining whether a convergence condition is reached according to the updated soft information, wherein the set of updated soft information are outputted for a decoding result when the number of times of iterative decoding of the decoder is greater than an iterative predetermined value or the decoder achieves the convergence condition.

12. The iterative decoding device of claim 1, wherein each of the soft information in the set of soft information is soft information passed from a check node to a bit node or from the bit node to the check node, and wherein the check node and the bit node are a column and a row in a parity-check matrix.

13. A method for iterative decoding for a decoder, comprising:
receiving a set of soft information, iteratively decoding the soft information, and updating the set of soft information to generate a set of updated soft information;
generating a determination result, which indicates that a scaling operation is needed to be performed or not, according to a threshold value and the set of updated soft information, wherein the threshold value is set to a first threshold value or a second value based on a comparison result of comparing a scaling counter value, which indicates the number of times that the scaling operation is performed, and a predetermined value; and
generating the scaling counter value and performing the scaling operation that is to scale the set of updated soft information according to the determination result, so as to generate a set of scaled soft information acting as an input of the decoder for next iteration.

14. The method for iterative decoding of claim 13, wherein the step of generating the determination result according to the threshold value and the set of soft information comprises generating the determination result according to the first threshold value and a set of high weight soft information of the set of updated soft information when the comparison result indicates that the scaling counter value is less than or equal to the predetermined value, wherein the set of high weight soft information is soft information of some nodes in a parity-check matrix which are with a relatively-large number of non-zero soft information in comparison with soft information of other nodes in the parity-check matrix, wherein a node in the parity-check matrix means a column or a row in the parity-check matrix.

15. The method for iterative decoding of claim 14, wherein the step of generating the determination result according to the first threshold value and the set of high weight soft information of the set of updated soft information comprises:
calculating absolute values of the set of high weight soft information to generate a set of the first adjustment signals;
calculating average energy of the set of high weight soft information to generate a first calculating result; and
comparing the first calculating result with the first threshold value to generate the determination result.

16. The method for iterative decoding of claim 15, wherein the step of comparing the first calculating result with the first threshold value to generate the determination result comprises generating the determination result for indicating performing the scaling operation when the first calculating result is greater than the first threshold value, and generating the determination result for indicating no performing the scaling operations when the first calculating result is less than the first threshold value.

17. The method for iterative decoding of claim 14, wherein the step of scaling the set of updated soft information according to the determination result to generate the set of scaled soft information comprises scaling the set of high weight soft information when the determination result indicates performing the scaling operation and the determination result is generated under a condition that the scaling counter value is less than or equal to the predetermined value, and accordingly generating the set of scaled soft information acting as the input of the decoder for next iteration.

18. The method for iterative decoding of claim 17, wherein the step of scaling the set of updated soft information according to the determination result to generate the set of scaled soft information acting as the input of the decoder for next iteration comprises accumulating the scaling counter value when the determination result indicates performing the scaling operation, and accordingly updating the scaling counter value.

19. The method for iterative decoding of claim 13, wherein the step of generating the determination result according to the set of updated soft information comprises generating the determination result according to the second threshold value and the set of updated soft information when the comparison result indicates that the scaling counter value is greater than the predetermined value.

20. The method for iterative decoding of claim 19, wherein the step of generating the determination result according to the second threshold value and the set of updated soft information comprises:
calculating absolute values of the set of updated soft information to generate a set of the second adjustment signals;
calculating average energy of the set of updated soft information to generate a set of the second calculating results; and
comparing the second calculating result with the second threshold value to generate the determination result.

21. The method for iterative decoding of claim 20, wherein the step of comparing the second calculating result with the second threshold value to generate the determination result comprises generating the determination result for indicating performing the scaling operation when the second calculating result is greater than the second threshold value, and generating the determination result for indicating no performing the scaling operations when the second calculating result is less than the second threshold value.

22. The method for iterative decoding of claim 19, wherein the step of scaling the set of updated soft information according to the determination result to generate the set of scaled soft information comprises scaling the set of updated soft information when the determination result indicates performing the scaling operation and the determination result is generated under a condition that the scaling counter value is greater than the predetermined value, and
accordingly generating the set of scaled soft information acting as the input of the decoder for next iteration.

23. The method for iterative decoding of claim 13, wherein the step of scaling the set of updated soft information comprises accumulating a number of times of iterative decoding of the decoder and determining whether a convergence condition is reached according to the updated soft information, wherein the set of updated soft information are outputted for a decoding result when the number of times of iterative decoding of the decoder is greater than the iterative predetermined value or the decoder achieves the convergence condition.

24. The method for iterative decoding of claim 13, wherein each of the soft information in the set of soft information is soft information passed from a check node to a bit node or from the bit node to the check node, and wherein the check node and the bit node are a column and a row in a parity-check matrix.

* * * * *